United States Patent
Maeda

(10) Patent No.: US 6,888,231 B2
(45) Date of Patent: May 3, 2005

(54) SURFACE MOUNTING SEMICONDUCTOR DEVICE

(75) Inventor: Masahide Maeda, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/853,784

(22) Filed: May 14, 2001

(65) Prior Publication Data

US 2002/0005573 A1 Jan. 17, 2002

(30) Foreign Application Priority Data

May 15, 2000 (JP) ........................................ 2000-141831

(51) Int. Cl.[7] .............................................. H01L 23/02
(52) U.S. Cl. ..................... 257/678; 257/666; 257/676; 257/796; 257/675; 257/705; 257/706; 257/775; 257/787; 257/692; 257/684
(58) Field of Search ................................ 257/684, 696, 257/666, 692, 693, 698, 676, 675, 735, 784, 796, 705, 706, 775, 787

(56) References Cited

U.S. PATENT DOCUMENTS

| 5,028,741 A | * | 7/1991 | Sanders et al. ............ 174/52.2 |
| 5,150,193 A | * | 9/1992 | Yasuhara et al. ............. 357/70 |
| 5,521,429 A | * | 5/1996 | Aono et al. ................. 257/676 |
| 5,977,613 A | * | 11/1999 | Takata et al. ............... 257/666 |
| 6,081,029 A | * | 6/2000 | Yamaguchi ................. 257/718 |

FOREIGN PATENT DOCUMENTS

| JP | 01128896 | * 5/1989 | ........... H01L/23/28 |
| JP | 11-345917 | 12/1999 | ........... H01L/23/28 |

* cited by examiner

Primary Examiner—Nathan J. Flynn
Assistant Examiner—Fazli Erdem
(74) Attorney, Agent, or Firm—Michael Bednarek; Shaw Pittman LLP

(57) ABSTRACT

A semiconductor device includes a semiconductor chip, an external connection electrode connected to the chip and a resin package for covering the chip. The resin package includes a mounting surface which faces a supporting substrate. The electrode includes a thick portion and a thin portion. The thick portion is partially exposed to the outside at the mounting surface of the package.

4 Claims, 8 Drawing Sheets

SURFACE MOUNTING SEMICONDUCTOR DEVICE

BACKGROUND OF THE INVENTION

1. Field of the Invention

The present invention relates to a surface mounting semiconductor device having a resin package. The present invention particularly relates to a semiconductor device provided with an electrode for external connection which does not include a bent portion. The present invention also relates to a lead frame used for making such a semiconductor device.

2. Description of the Related Art

JP-A-11-345917 discloses an example of prior-art semiconductor device. As shown in FIG. 10 of the accompanying drawings, the prior art semiconductor device (generally indicated by a reference sign B) includes a semiconductor chip 90, a first lead 91A and a second lead 91B. The chip 90 is mounted on the first lead 91A in electrical conduction therewith. The chip 90 is connected via a wire W to the second lead 91B. The semiconductor device B further includes a resin package 92 for sealing the chip 90 and the wire W.

As shown in FIG. 10, each of the first and the second leads 91A, 91B is partially covered with the package 92. Specifically, each lead 91A, 91B includes an upper horizontal portion 93, a lower horizontal portion 94, and a vertical portion 95 for connecting the two horizontal portions 93, 94 to each other. Among these portions, the upper horizontal portions 93 and the vertical portions 95 are covered with the package 92, whereas the lower horizontal portions 94 are located outside the package 92 to extend along the bottom surface 92e of the package 92. The leads 91A, 91B are formed by bending a metal lead frame.

The prior art semiconductor device B has the following problems. Firstly, the bending of the lead frame for providing the first lead 91A and the second lead 91B is troublesome, increasing the time and cost for making the semiconductor device. Secondly, the existence of the vertical portions 95 (having a length S) of the leads 91A, 91B tends to increase the height of the semiconductor device B, which is disadvantageous.

SUMMARY OF THE INVENTION

An object of the present invention, which is conceived under the above-described circumstances, is to provide a thin semiconductor device which can be made easily. Another object of the present invention is to provide a lead frame suitable for making such a semiconductor device.

In accordance with a first aspect of the present invention, there is provided a semiconductor device comprising a semiconductor chip, an external connection electrode connected to the chip, and a resin package which covers the chip and has a mounting surface. The electrode includes a thick portion and a thin portion, and the thick portion is exposed to outside at the mounting surface of the package.

Preferably, the electrode has a flat upper surface for mounting the chip, and the thick portion includes a downward projection extending from the upper surface to the mounting surface of the package.

Preferably, the projection includes an end surface exposed to the outside at the mounting surface of the package and side surfaces closely covered with the package.

Preferably, the thick portion and the thin portion are formed of a same material and integral with each other.

Preferably, the electrode includes two thick portions spaced from each other and a thin portion connecting the thick portions, and both of the two thick portions are exposed to the outside at the mounting surface of the package.

Preferably, the package includes a side surface which is different from the mounting surface, and the thin portion includes a horizontal extension exposed to the outside at the side surface of the package.

Preferably, the horizontal extension is spaced from the mounting surface of the package.

Preferably, the semiconductor device according to the present invention further includes an additional electrode separate from the external connection electrode. The additional electrode includes a thick portion and a thin portion, and the thick portion of the additional electrode is exposed to the outside at the mounting surface of the package.

Preferably, the external connection electrode includes a first flat surface for mounting the chip, and the additional electrode includes a second flat surface for connection to the chip via a wire. The first surface and the second surface are flush with each other.

In accordance with a second aspect of the present invention, there is provided a lead frame for making a semiconductor device, the frame comprising a plurality of thick portions which are equal in thickness to each other, a plurality of thin portions which are equal in thickness to each other, and a plurality of openings.

Other features and advantages of the present invention will become clearer from the description of embodiments given below.

DETAILED DESCRIPTION OF THE PREFERRED EMBODIMENT

Preferred embodiments of the present invention will be described below with reference to the accompanying drawings.

FIGS. 1–4 illustrate a semiconductor device Sa in accordance with a first embodiment of the present invention. As seen from FIGS. 1 and 2, the semiconductor device Sa includes a semiconductor chip 1, three electrodes 2A–2C (see FIG. 2) for external connection, and a resin package 3.

Figure 1:
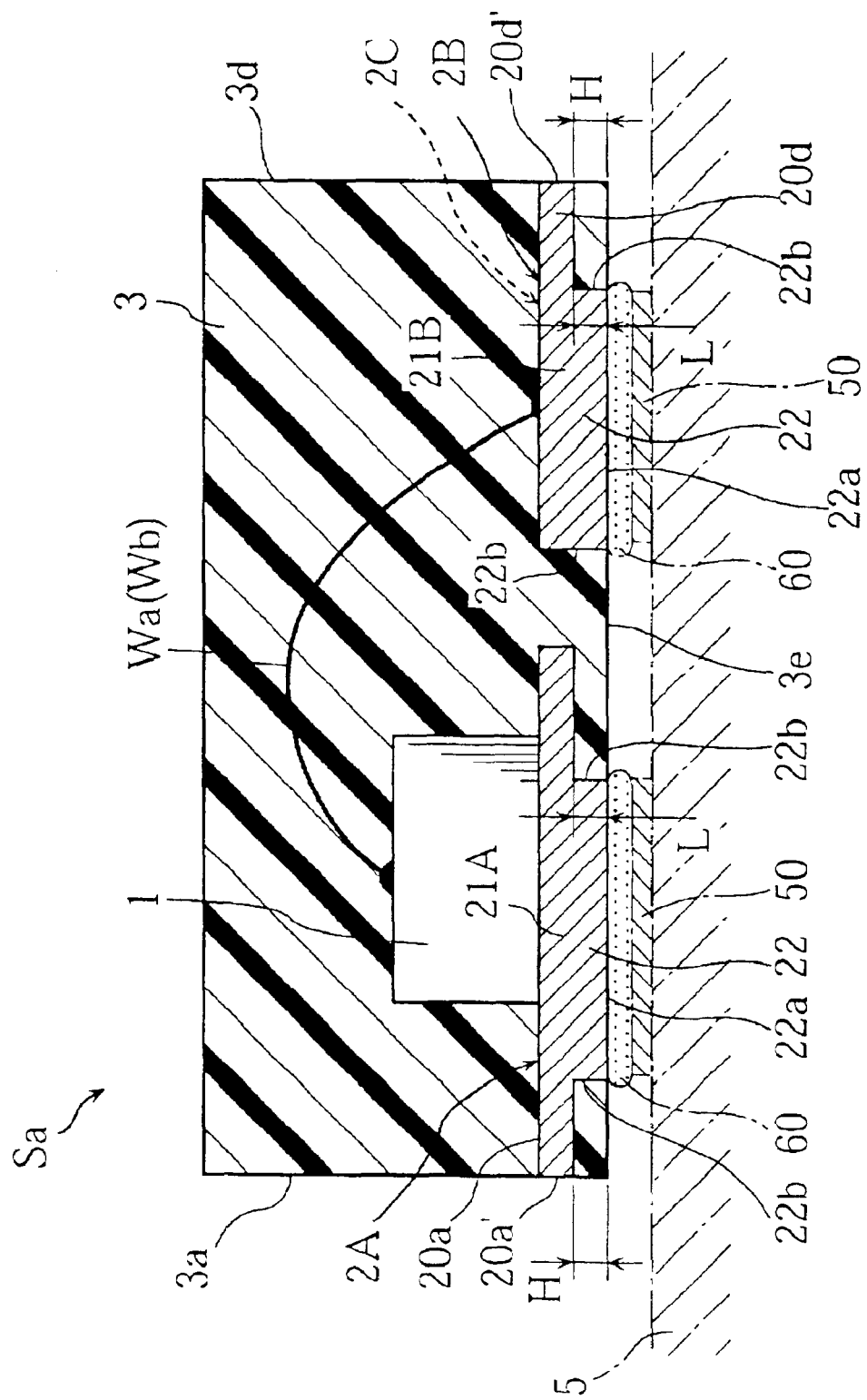
FIG. 1 is a sectional view showing a semiconductor device in accordance with a first embodiment of the present invention.
Figure 2:
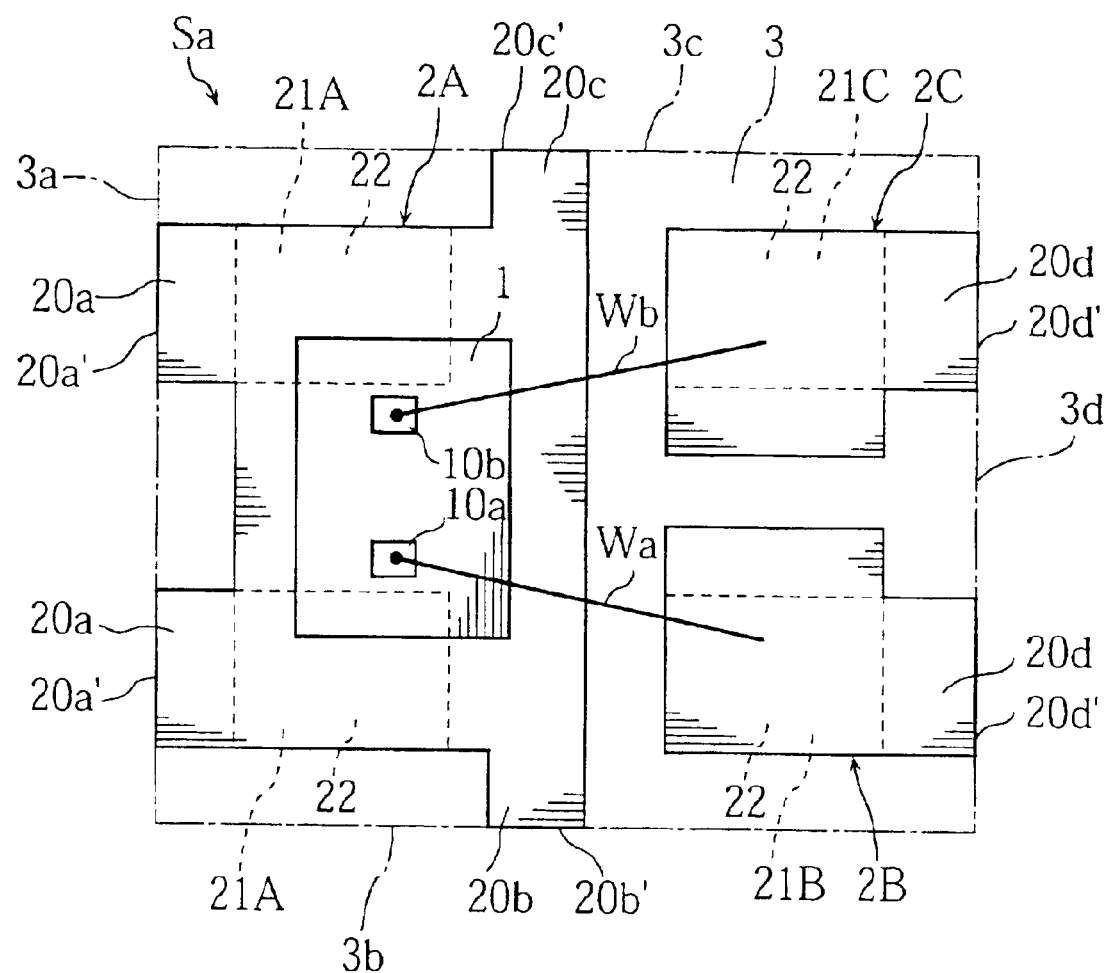
FIG. 2 is a plan view showing an arrangement of external electrodes in the semiconductor device shown in FIG. 1.

As shown in FIG. 1, the semiconductor chip 1 is mounted on the first external connection electrode 2A. Though not illustrated, the bottom surface of the chip 1 is provided with a conductive pad for connection to the first electrode 2A. As shown in FIG. 2, the semiconductor chip 1 has an upper surface provided with two conductive pads 10a, 10b. One pad 10a is connected via a wire Wa to the second external connection electrode 2B, whereas the other pad 10b is connected via a wire Wb to the third external connection electrode 2C.

The resin package 3 may be made of an epoxy resin. In the illustrated embodiment, the package 3 is in the form of a rectangular parallelepiped, covering the semiconductor chip 1, the wires Wa, Wb and the external connection electrodes 2A–2C.

The external connection electrodes 2A–2C may be made of copper. As shown in FIG. 1, all the external connection electrodes 2A–2C are arranged adjacent to the bottom surface 3e of the resin package 3. The respective external connection electrodes 2A–2C have flat upper surfaces which are flush with each other.

Figure 3:
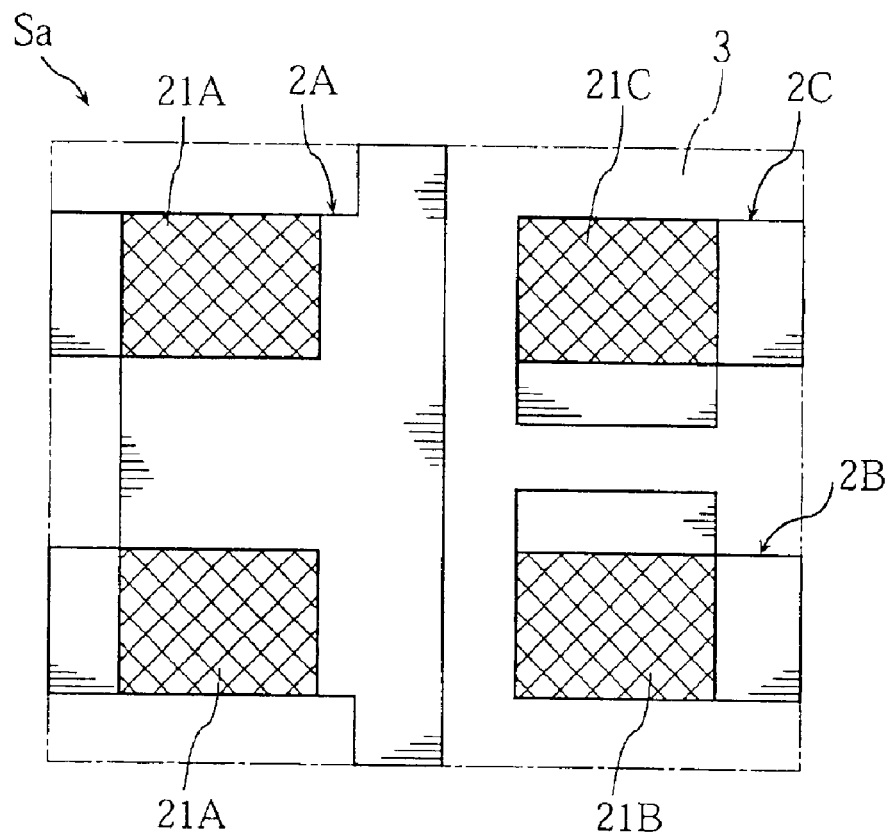
FIG. 3 is a plan view showing the position of thick portions of the electrode shown in FIG. 2.
Figure 4:
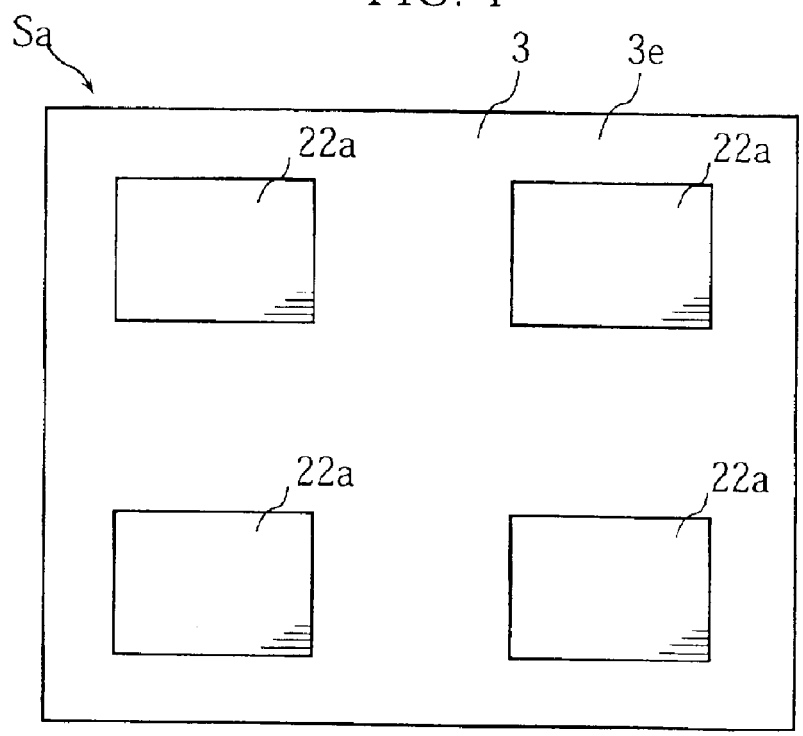
FIG. 4 is a bottom view of the semiconductor device shown in FIG. 1.

As clearly shown in FIGS. 2 and 3, the external connection terminal 2A includes relatively thick first portions 21A and the remaining portion (a second portion) which is relatively thin. As shown in FIG. 2, the thin portion (second portion) includes two first horizontal extensions 20a, one second horizontal extension 20b, and one third horizontal extension 20c. The first horizontal extensions 20a extend toward a first side surface 3a of the package 3, the second horizontal extension 20b extends toward a second side surface 3b of the package 3, and a third horizontal extension 20c extends toward a third side surface 3c of the package 3. Each of the first horizontal extensions 20a has an end surface 20a' which is substantially flush with the first side surface 3a. The second horizontal extension 20b has an end surface 20b' which is substantially flush with the second side surface 3b. The third horizontal extension 20c has an end surface 20c' which is substantially flush with the third side surface 3c. The end surface 20a', 20b' and 20c' are exposed to the outside.

Similarly to the first external electrode 2A, each of the second and third external electrodes 2B, 2C has a thick portion 21B or 21C, and the remaining portion (thin portion) which is thinner than the thick portion (see FIGS. 2 and 3). As shown in FIG. 2, the wire Wa is bonded to the thick portion 21B of the second external electrode 2B, whereas the wire Wb is bonded to the thick portion 21C of the third external electrode 2C. Each thin portion of the external electrodes 2B, 2C includes a horizontal extension 20d extending toward a fourth side surface 3d of the resin package 3. Each horizontal extension 20d has an end surface 20d' which is substantially flush with the fourth side surface 3d.

As shown in FIG. 1, each of the thick portions 21A–21C includes a downward projection 22 projecting downward by a predetermined length L relative to the thin portion. Each downward projection 22 has a bottom surface 22a which is flush (or generally flush) with the bottom surface 3e of the resin package 3 (see FIG. 4). The downward projection 22 has side surfaces 22b covered with the resin package 3. The horizontal extensions 20a–20d of the electrodes 2A–2C are located higher than the bottom surface 3e of the resin package 3 by an appropriate height H. When the bottom surface 22a of each downward projection 22 is precisely flush with the bottom surface 3e of the resin package 3, the height H is equal to the projecting length L.

Next, a method of making the semiconductor device Sa will be described.

Figure 5:
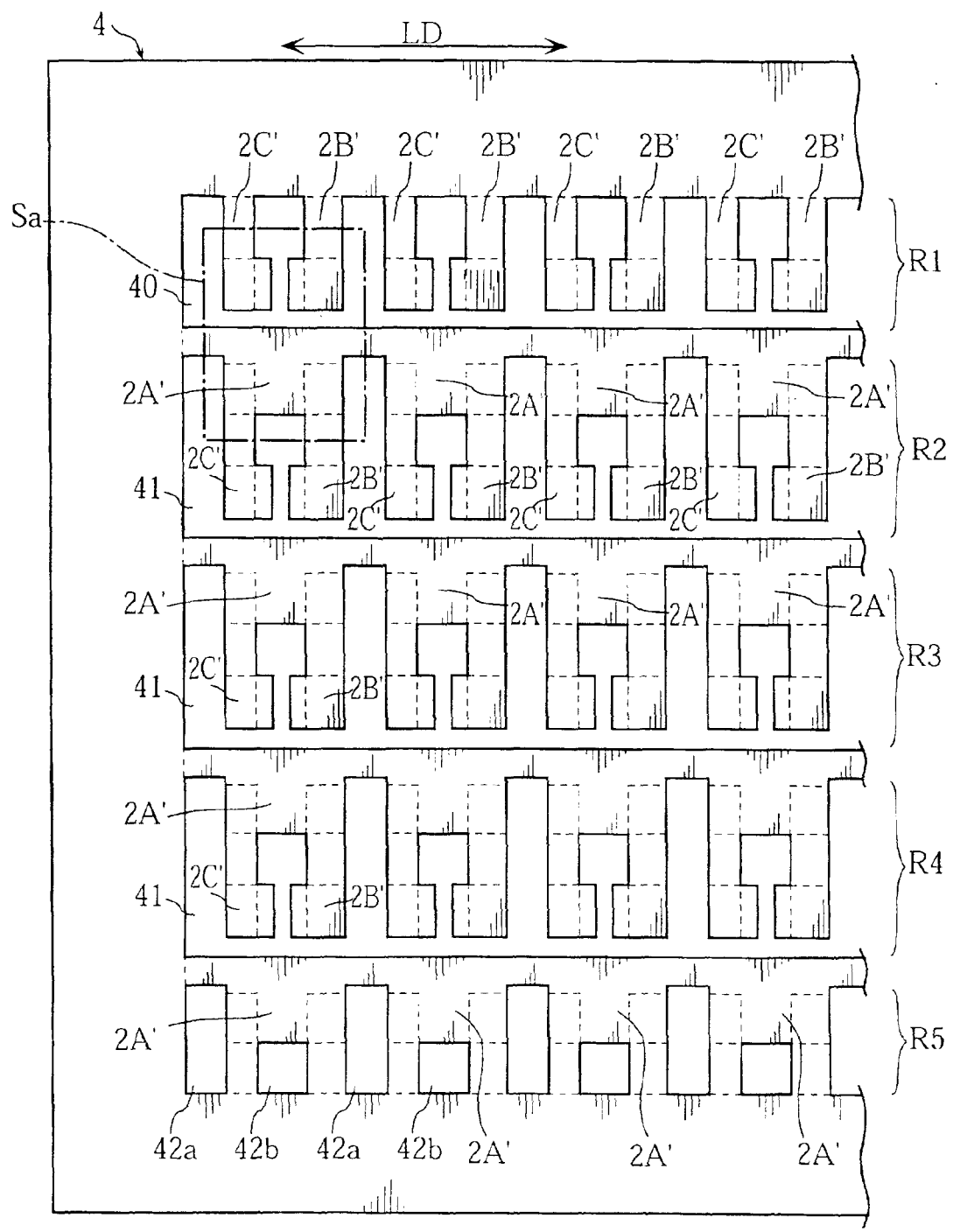
FIG. 5 is a plan view showing a lead frame used for making the semiconductor device shown in FIG. 1.

FIG. 5 is a plan view showing a lead frame (generally indicated by a reference sign 4) for use in making a semiconductor device Sa. The frame 4 is provided with plural pairs of right and left legs 2B', 2C' arranged in a first row R1 extending in the longitudinal direction LD indicated in the figure. The legs 2B', 2C' are defined by a punched portion 40 provided in the frame 4. The frame 4 also includes plural sets of a right leg 2B', a left leg 2C', and a waist 2A' arranged in a second row R2 extending in the longitudinal direction LD. These elements 2B', 2C' and 2A' are defined by a punched portion 41 provided in the frame 4. The region defined by chain lines provides the external connection terminals 2A–2C of the above-described semiconductor device Sa.

Additionally, the frame 4 is provided with elements which are similar to the above described elements (2A', 2B', 2C') of the second row R2. As shown in FIG. 5, these additional elements are arranged in a third row R3 and a fourth row R4. In a fifth or last row R5, relatively long openings 42a and relatively short openings 42b are alternately arranged. In the fifth row, a waist 2A' is arranged between each two adjacent openings 42a.

Figure 6:
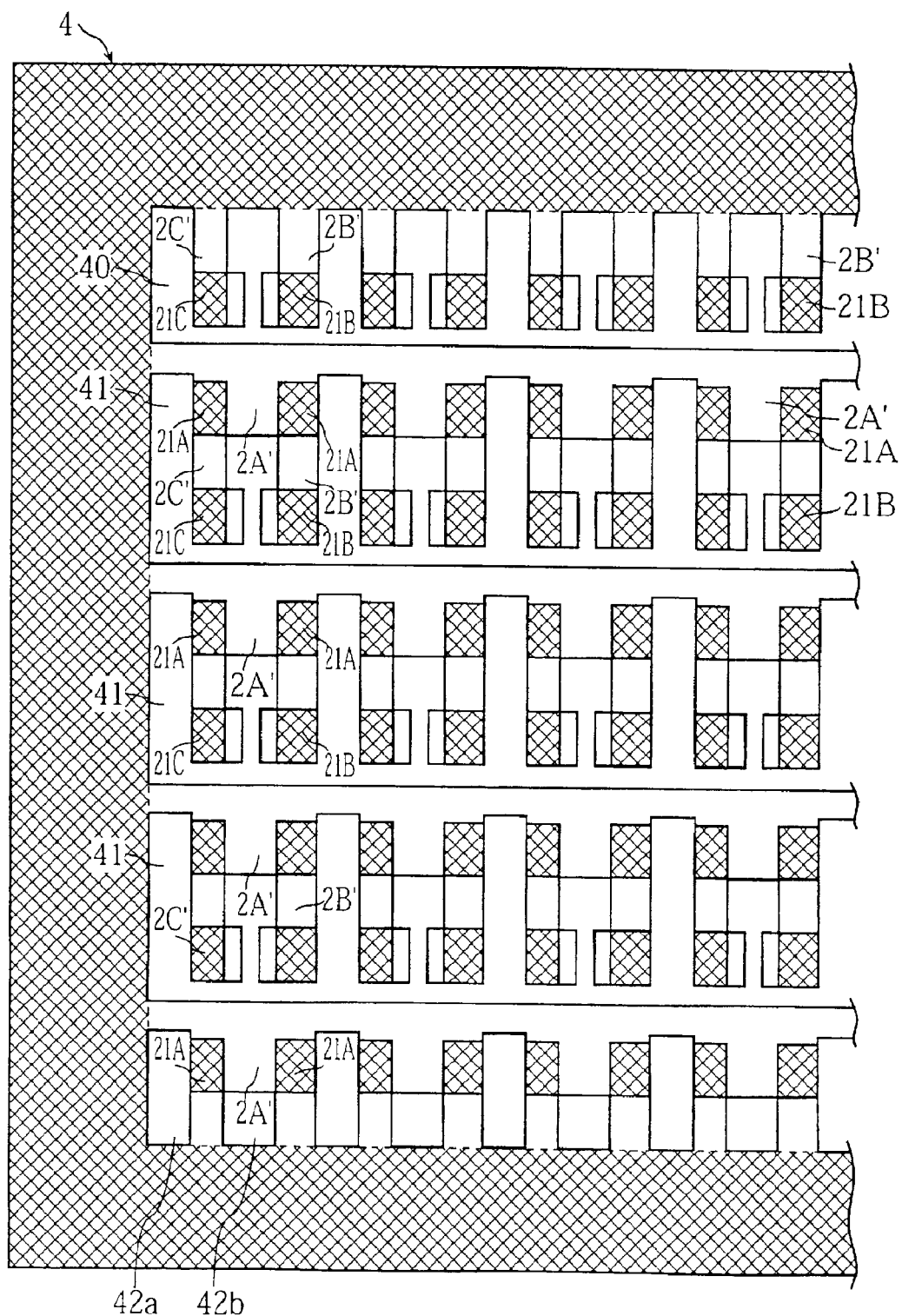
FIG. 6 is a plan view showing thick portions and thin portions of the lead frame of FIG. 5.

The frame 4 includes thick portions of a relatively large thickness and thin portions of a relatively small thickness. In FIG. 6, which is a plan view showing the reverse surface of the frame 4, crisscross-hatching is applied to indicate the thick portions. The remaining portions of the frame 4 are the thin portions. As shown in the figure, each waist 2A' includes the thick portions 21A, and each leg 2B', 2C' includes the corresponding thick portion 21B, 21C. The thickness of the thick portions is equal to the original thickness of the frame 4.

The frame 4 may be obtained in the following manner. Firstly, an elongated rectangular copper plate having a uniform thickness is punched by press working to provide punched portions 40, 41 and openings 42a, 42b as shown in FIG. 5. Then the reverse surface of the pressed copper plate is covered with a resist film at predetermined portions (corresponding to crisscross-hatched portions in FIG. 6). Then, the reverse surface of the copper plate is subjected to etching. As a result, a frame 4 is obtained which includes thin portions and thick portions as required.

Figure 7:
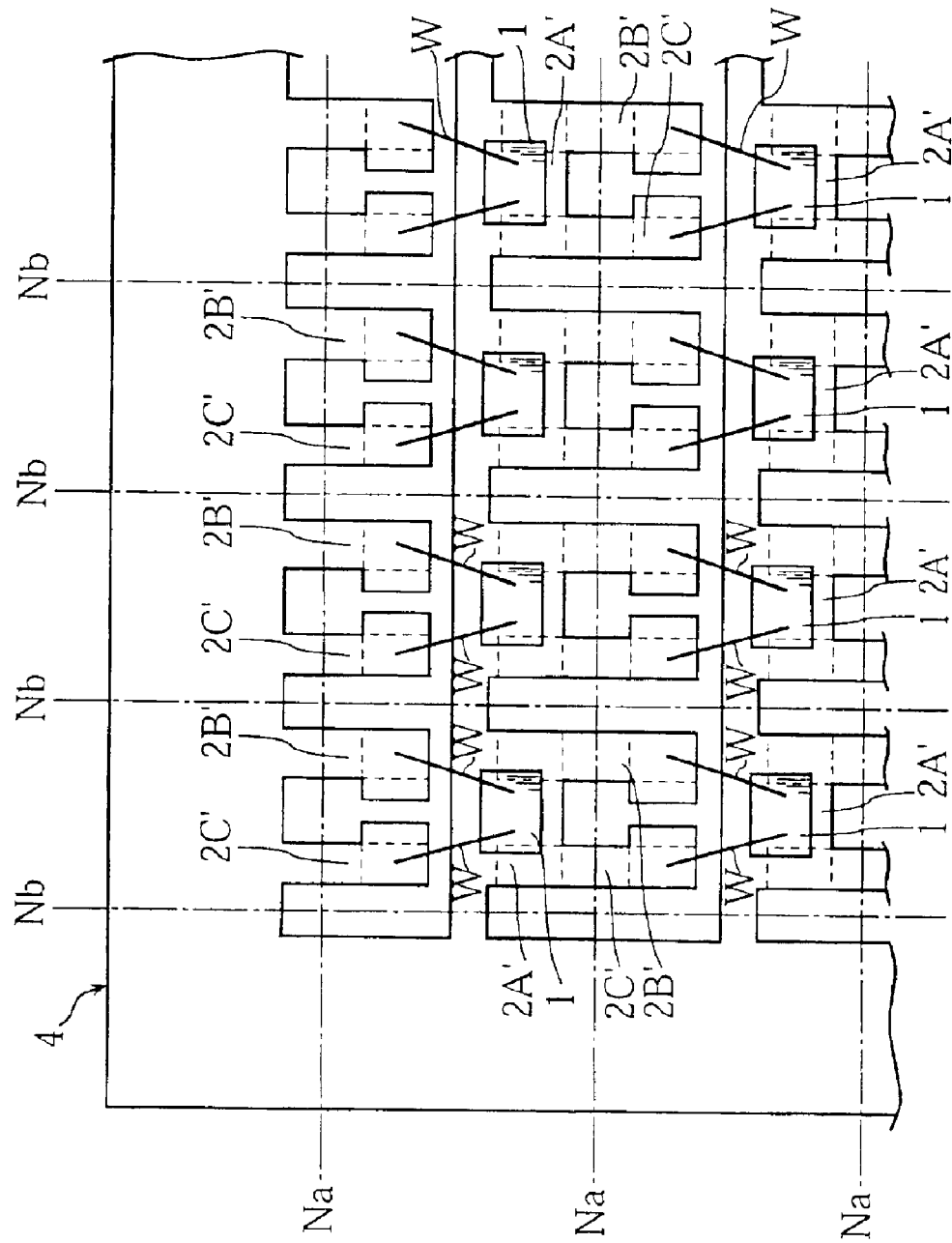
FIG. 7 is a plan view showing a step of making the semiconductor device of FIG. 1.

After the frame 4 is thus obtained, semiconductor chips 1 are mounted onto the waists 2A' of the frame 4, as shown in FIG. 7. Then, each semiconductor chip 1 is connected to the relevant legs 2B', 2C' via wires W. Subsequently, the frame 4 is entirely or generally entirely sealed with e.g., an epoxy resin (not shown) for covering the semiconductor chips 1 and the wires W. This sealing may be performed by transfer molding utilizing a mold or printing the resin material on the frame 4. This sealing is carried out so as not to cover predetermined portions (corresponding to the bottom surface 22a of each downward projection 22 of the semiconductor device Sa) with resin. After the resin sealing is completed, the resin and the frame 4 are cut along phantom lines Na, Nb shown in FIG. 7. As a result, a plurality of semiconductor devices Sa shown in FIGS. 1–4 are collectively obtained. Cut surfaces of the frame 4 become the end surfaces 20a'–20d' of the external electrodes 2A–2C.

According to the above-described method, the semiconductor device Sa can be made without bending the frame 4.

Figure 10:
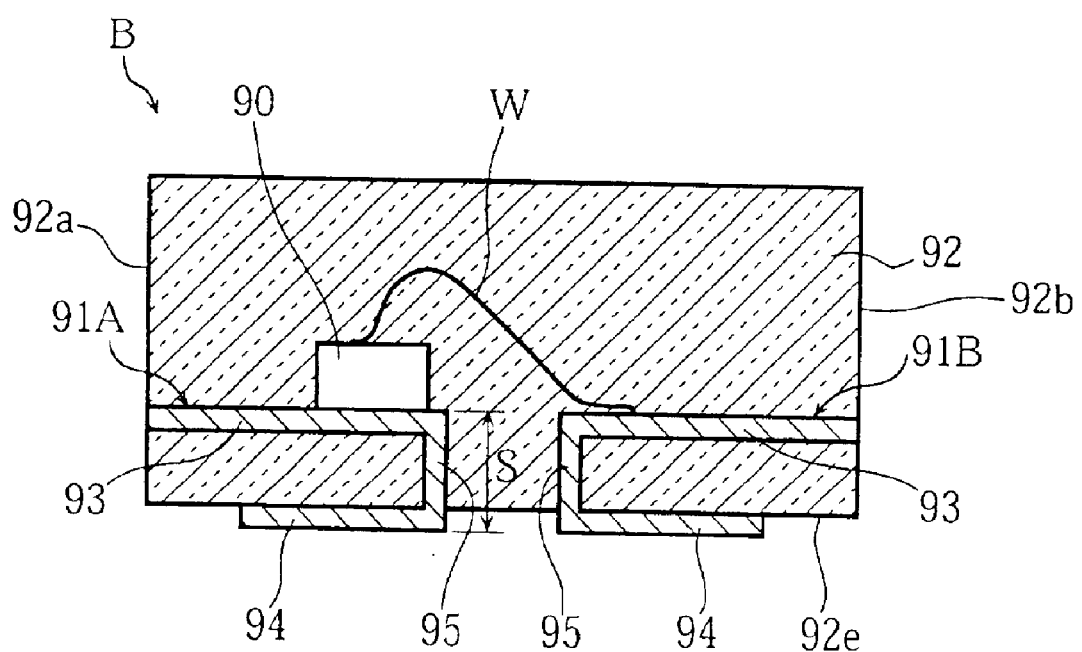
FIG. 10 is a sectional view showing a prior art semiconductor device.

Therefore, the semiconductor device Sa of this embodiment can be made more easily and with less manufacturing cost than the prior art semiconductor device shown in FIG. 10.

Next, the manner of mounting the semiconductor device Sa and the advantages of the device will be described.

As shown in FIG. 1, the semiconductor device Sa is surface-mounted on a desired substrate 5 through the bottom surfaces 22a of the downward projections 22 of the external electrodes 2A–2C. In the illustrated embodiment, the external electrodes 2A–2C are electrically and mechanically connected to conductor pads 50 of the substrate 5 via solder 60. By reflow soldering, it is possible to automatically position the semiconductor device Sa relative to the substrate 5.

The bottom surface 22a of each downward projection 22 is flush or generally flush with the bottom surface 3e of the resin package 3. As a result, the bottom surface 3e of the resin package 3 is not unduly spaced from the substrate 5. This is advantageous to mounting the semiconductor device Sa stably on the substrate.

Figure 8:
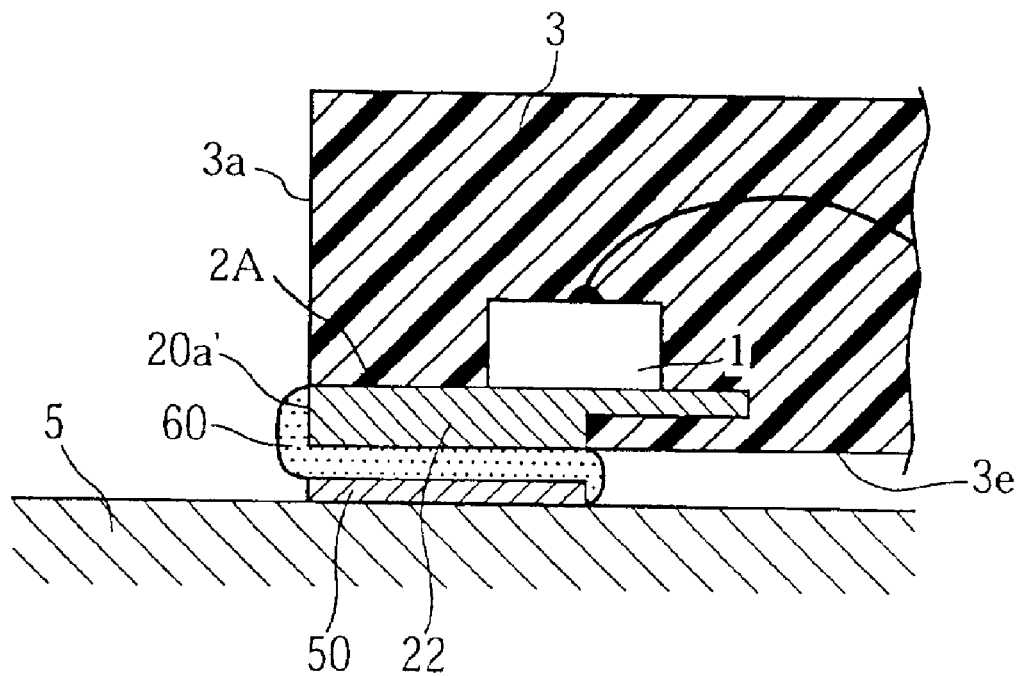
FIG. 8 is a sectional view showing a comparable example of semiconductor device.

With the semiconductor device Sa mounted on the substrate 5, the solder 60 may partially project from between the downward projections 22 and the relevant electrode pads 50. In the semiconductor device Sa, however, the projecting solder 60 is effectively prevented from adhering to the end surfaces 20a'–20d' of the external electrodes 2A–2C, since the end surfaces 20a'–20d' are located higher than the bottom surface 3e of the resin package 3 by an appropriate amount H. To elaborate on this, reference is now made to a comparable example. It is supposed that the downward projection 22 of the external electrode 2A extends to the side surface 3a of the resin package 3, as shown in FIG. 8. In such a case, the projecting solder 60 is likely to adhere to the end surface 20a' of the electrode 2A. Unfavorably, when the illustrated semiconductor device, with the solder 60 adhered to the end surface 20a', is mounted on the substrate 5 together with another semiconductor device, the solder 60 may contact the second semiconductor device. To avoid this drawback, there may be no other way but to reduce the mounting density on the substrate 5.

However, with the semiconductor device Sa according to the embodiment of the present invention, it is possible to prevent the solder 60 from adhering to the end surfaces 20a'–20d'. Therefore, it is possible to sufficiently reduce the clearance between the semiconductor device Sa and another semiconductor device, which leads to an increase in the mounting density.

Moreover, according to the semiconductor device Sa of the present invention, the downward projection 22 of each external electrode 2A–2C is closely surrounded by the resin package 3. As a result, the external electrodes 2A–2C are reliably fixed to the resin package 3. Further, since the external electrodes 2A–2C are not bent, the external electrodes 2A–2C have a smaller height than those of the prior-art semiconductor device shown in FIG. 10. Therefore, the thickness of the semiconductor device Sa can be reduced.

Figure 9:
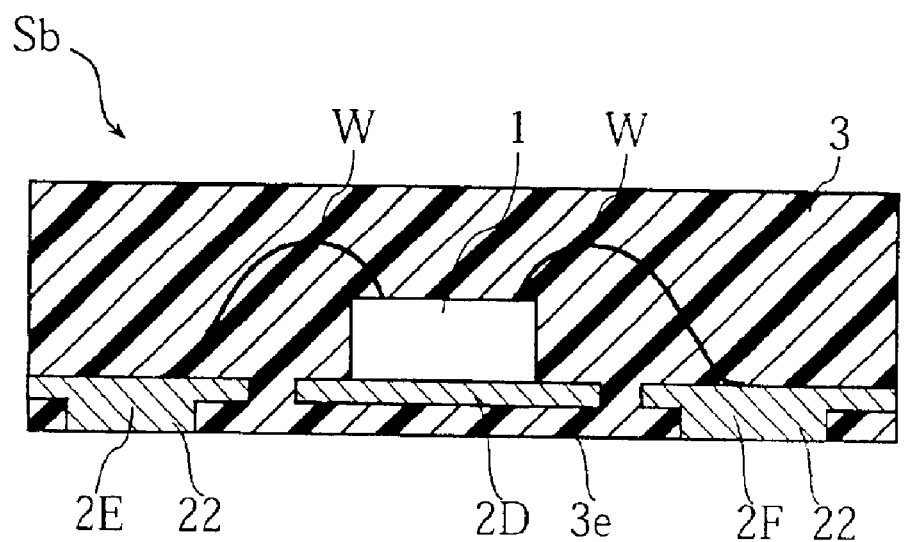
FIG. 9 is a sectional view showing a semiconductor device in accordance with a second embodiment of the present invention.

FIG. 9 is a sectional view showing a semiconductor device Sb in accordance with a second embodiment of the present invention. In the semiconductor device Sb, a connection pad (not shown) is provided on the upper surface of a semiconductor chip 1 but not provided on the lower surface of the chip. The semiconductor chip 1 is mounted on a conductive support plate 2D instead of an external electrode 2E or 2F. The chip 1 is connected to the external electrodes 2E, 2F via wires W. Each external electrode 2E, 2F has a downward projection 22 which is exposed to the outside at the bottom surface 3e of the package 3. Since a connection pad is not provided on the lower surface of the chip 1 as is in this embodiment, the support plate 2D may be entirely covered with the package 3 without being partially exposed to the outside of the package 3.

Although each external electrode 2A–2C includes only a thick portion and a thin portion in the first and the second embodiments described above, the present invention is not limited to this structure. Alternatively, for example, each external electrode may include a medium thickness portion in addition to the thick portion and the thin portion.

The preferred embodiments of the present invention being thus described, it is apparent that the same maybe varied in many ways. Such variations should not be regarded as a departure from the scope of the present invention, and all such modifications as would be obvious to those skilled in the art are intended to be included within the scope of the following claims.

What is claimed is:

1. A semiconductor device comprising:

a semiconductor chip;

a first external connection electrode connected to the chip;

a second external connection electrode connected to the chip; and a resin package that covers the chip and has a mounting surface, the resin package also including a first side surface, a second side surface adjacent to the first side surface, a third side surface opposite to the second side surface, and a fourth side surface opposite to the first side surface;

wherein each of the first and second electrodes includes a thick portion and a thin portion, the thick portion being exposed to outside only at the mounting surface of the package, the thick portion being not exposed at the first to fourth surfaces of the package;

wherein the thin portion of the first electrode includes a first extension and a second extension, the first extension being spaced from the mounting surface of the package and exposed at the first side surface of the package, the second extension being spaced from the mounting surface and the first side surface of the package while extending toward the second electrode, the thin portion of the second electrode being spaced from the mounting surface of the package and exposed at the fourth side surface of the package; and wherein the first electrode includes two thick portions spaced from each other and a thin portion connecting the thick portions, both of the two thick portions being exposed to outside only at the mounting surface of the package.

2. A semiconductor device comprising:

a semiconductor chip;

a first external connection electrode connected to the chip;

a second external connection electrode connected to the chip; and a resin package that covers the chip and has a mounting surface, the resin package also including a first side surface, a second side surface adjacent to the first side surface, a third side surface opposite to the second side surface, and a fourth side surface opposite to the first side surface;

wherein each of the first and second electrodes includes a thick portion and a thin portion, the thick portion being exposed to outside only at the mounting surface of the package, the thick portion being not exposed at the first to fourth surfaces of the package;

wherein the thin portion of the first electrode includes a first extension and a second extension, the first extension being spaced from the mounting surface of the package and exposed at the first side surface of the package, the second extension being spaced from the mounting surface and the first side surface of the package while extending toward the second electrode, the thin portion of the second electrode being spaced from the mounting surface of the package and exposed at the fourth side surface of the package; and wherein the first external connection electrode includes a first flat surface for mounting the chip, the second external connection electrode including a second flat surface for connection to the chip via a wire, the first surface and the second surface being flush with each other.

3. A semiconductor device comprising:

a semiconductor chip;

a first external connection electrode connected to the chip;

a second external connection electrode connected to the chip; and a resin package that covers the chip and has a mounting surface, the resin package also including a first side surface, a second side surface adjacent to the first side surface, a third side surface opposite to the second side surface, and a fourth side surface opposite to the first side surface;

wherein each of the first and second electrodes includes a thick portion and a thin portion, the thick portion being exposed to outside only at the mounting surface of the package, the thick portion being not exposed at the first to fourth surfaces of the package;

wherein the thin portion of the first electrode includes a first extension and a second extension, the first extension being spaced from the mounting surface of the package and exposed at the first side surface of the package, the second extension being spaced from the mounting surface and the first side surface of the Package while extending toward the second electrode, the thin portion of the second electrode being spaced from the mounting surface of the package and exposed at the fourth side surface of the package; and wherein the second extension of the first external connection electrode projects toward and is exposed at the second side surface of the package.

4. A semiconductor device comprising:

a semiconductor chip;

a first external connection electrode connected to the chip;

a second external connection electrode connected to the chip; and a resin package that covers the chip and has a mounting surface, the resin package also including a first side surface, a second side surface adjacent to the first side surface, a third side surface opposite to the second side surface, and a fourth side surface opposite to the first side surface;

wherein each of the first and second electrodes includes a thick portion and a thin portion, the thick portion being exposed to outside only at the mounting surface of the package, the thick portion being not exposed at the first to fourth surfaces of the package;

wherein the thin portion of the first electrode includes a first extension and a second extension, the first extension being spaced from the mounting surface of the package and exposed at the first side surface of the package, the second extension being spaced from the mounting surface and the first side surface of the package while extending toward the second electrode, the thin portion of the second electrode being spaced from the mounting surface of the package and exposed at the fourth side surface of the package; and wherein the first external connection electrode further includes a third extension projecting toward and exposed at the third side surface of the package.

* * * * *